(12) United States Patent
Wong et al.

(10) Patent No.: US 7,478,307 B1
(45) Date of Patent: *Jan. 13, 2009

(54) METHOD FOR IMPROVING UN-CORRECTABLE ERRORS IN A COMPUTER SYSTEM

(75) Inventors: Tayung Wong, Fremont, CA (US); Kenneth J. Gibbons, Bridge of Allan (GB); Neil N. Duncan, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 646 days.

This patent is subject to a terminal disclaimer.

(21) Appl. No.: 11/133,056

(22) Filed: May 19, 2005

(51) Int. Cl.
*G11C 29/00* (2006.01)
(52) U.S. Cl. .................. 714/763; 714/758; 714/799
(58) Field of Classification Search ............ 714/6, 714/761, 762, 763, 766, 758, 799
See application file for complete search history.

(56) References Cited

U.S. PATENT DOCUMENTS

| | | | |
|---|---|---|---|
| 4,334,309 A | 6/1982 | Bannon et al. | |
| 4,359,772 A | 11/1982 | Patel | |
| 4,845,664 A | 7/1989 | Aichelmann, Jr. et al. | |
| 4,862,462 A | 8/1989 | Zulian | |
| 5,164,944 A | 11/1992 | Benton et al. | |
| 5,270,964 A | 12/1993 | Bechtolsheim et al. | |
| 5,291,498 A | 3/1994 | Jackson et al. | |
| 5,450,424 A | 9/1995 | Okugaki et al. | |
| 5,465,262 A | 11/1995 | Dell et al. | |
| 5,477,551 A | 12/1995 | Parks et al. | |
| 5,491,702 A | 2/1996 | Kinsel | |
| 5,583,786 A | 12/1996 | Needham | |
| 5,642,366 A | 6/1997 | Lee et al. | |
| 5,784,391 A | 7/1998 | Konigsburg | |
| 6,076,182 A * | 6/2000 | Jeddeloh | 714/763 |
| 6,256,753 B1 | 7/2001 | Williams | |
| 6,304,992 B1 | 10/2001 | Cypher | |
| 6,469,854 B1 | 10/2002 | Gill et al. | |
| 6,560,725 B1 | 5/2003 | Longwell et al. | |
| 6,574,746 B1 * | 6/2003 | Wong et al. | 714/6 |
| 6,614,862 B1 | 9/2003 | Doblar | |
| 6,701,469 B1 | 3/2004 | Matter et al. | |
| 6,745,359 B2 | 6/2004 | Nadeau-Dostie | |
| 6,751,321 B1 | 6/2004 | Kato et al. | |
| 6,886,121 B2 | 4/2005 | Dervisoglu et al. | |
| 6,901,546 B2 | 5/2005 | Chu et al. | |
| 6,941,493 B2 | 9/2005 | Phelps | |
| 6,973,612 B1 * | 12/2005 | Rodi | 714/766 |

(Continued)

OTHER PUBLICATIONS

Anshuman Chandra, "System-on-a-Chip Test-Data Compression and Decompression Architectures Based on Golomb Codes," IEEE, 2001, pp. 355-368.

*Primary Examiner*—Esaw T Abraham
(74) *Attorney, Agent, or Firm*—Meyertons Hood Kivlin Kowert & Goetzel, P.C.; Rory D. Rankin

(57) ABSTRACT

A system and method for storing error correction check words in computer memory modules. Check bits stored within a given word line in a dynamic random access memory (DRAM) chip are assigned to different check words. By assigning check bits to check words in this manner, multi-bit soft errors resulting from the failure of a word line will appear as single-bit errors to an error correction subsystem.

18 Claims, 9 Drawing Sheets

U.S. PATENT DOCUMENTS

| | | |
|---|---|---|
| 6,973,613 B2 | 12/2005 | Cypher |
| 6,976,194 B2 | 12/2005 | Cypher |
| 6,996,766 B2 | 2/2006 | Cypher |
| 7,272,757 B2 * | 9/2007 | Stocken ..................... 714/718 |
| 7,398,449 B1 * | 7/2008 | Normoyle et al. ........... 714/767 |
| 2004/0133831 A1 | 7/2004 | Williams et al. |
| 2004/0133832 A1 | 7/2004 | Williams et al. |
| 2005/0249010 A1 * | 11/2005 | Klein ........................ 365/222 |

* cited by examiner

METHOD FOR IMPROVING UN-CORRECTABLE ERRORS IN A COMPUTER SYSTEM

BACKGROUND OF THE INVENTION

1. Field of the Invention

This invention relates to memory within computer systems, and more specifically, to error correction systems for detecting and correcting errors that may be present in data stored or transmitted to and from system memory.

2. Description of the Relevant Art

For data transmissions occurring within a given computer system, there always exists the possibility that the transmitted data includes an error. This is also true when the source of the transmitted data is a dynamic random access memory (DRAM). The majority of errors that occur in a DRAM chip are soft errors, which are correctable. Hard errors may occur as well, and some hard errors may be correctable, but their occurrence is typically less frequent than the occurrence of soft errors. Two primary sources of soft errors are alpha particles and cosmic rays. Since a DRAM stores a given bit via a charge, an alpha particle or cosmic ray can alter this charge, thereby changing the contents of a given memory cell.

As the amount of main memory in computer systems has continued to increase, the frequency of soft errors has increased correspondingly. Soft errors, if left uncorrected, can have adverse effects on system performance, corrupting data and even causing system crashes. One measure of the possibility of such failure is referred to as Mean Time between Failures (MTBF). Uncorrected soft errors can reduce the MTBF of a given computer system.

In order to counter the presence of errors, many computers employ error correction circuitry. Such circuitry is used to implement error correction codes (ECCs), which are used to detect and correct errors within a computer system. There are many different types of ECCs. Some of the more commonly used codes are referred to as Hamming codes, although many others have been developed. In some error correction systems, a bit pattern, such as one representing an ASCII character, is recoded with redundant bits, more commonly referred to a check bits. Groups of check bits may be referred to as check words, and each data block stored in a DRAM may be protected by at least one check word.

Parity is another element of many error correction codes. Even parity is defined as adding a check bit so that the total number of logic ones in a given bit pattern is even, while odd parity involves adding a check bit so that the total number of logic ones is odd. In a system where even parity is in use, the receipt of a word (including check bits) which contains an odd number of logic ones automatically indicates the presence of an error in the data. Receipt of a word containing an even number of logic ones in an odd parity system will also indicate the presence of an error.

Many error correction schemes can correct only one error within a given data word. Some error correction schemes allow the detection of two errors, but these schemes are usually unable to unambiguously correct both of them. As previously mentioned, many soft errors in a DRAM are caused by cosmic rays or Alpha particles. Alpha particles are localized phenomena, and in many cases, can alter the contents of multiple bits in the general area in which they occur. Similarly, cosmic rays, while not a localized phenomena, can nevertheless bombard a semiconductor memory with protons and neutrons, randomly altering the stored bits. Since a number of error correction schemes assign physically adjacent check bits within the DRAM to a given check word, there is an increased possibility of uncorrectable multi-bit soft errors occurring within a given check word. Furthermore, data bits protected by a given check word may be altered in the same manner.

The relationship between DRAM cell architecture and DRAM input/output (I/O) architecture may have an affect on the manner in which given check bits are assigned to check words. For example, in some DRAM chips with sixteen data lines D0-D15, the cell layout may result in cells connected to a data line D15 being physically adjacent to cells connected data line D0, although these two bits are not logically adjacent. In other DRAM chips, D0 may be adjacent to D1, D1 is adjacent to D2, and so on. Check bits on these data lines are often assigned to the same check word. Consequently, the actual layout of the DRAM cell architecture can affect the ability to detect and/or correct data errors.

FIG. 1 illustrates one prior art example of a memory array within a DRAM, wherein check bits which are assigned to a same check word are stored in non-adjacent locations. When certain phenomena occur, such as alpha particle radiation, multiple adjacent bits stored in a memory array can be altered, causing multi-bit errors. As may be appreciated, multi-bit errors are generally more difficult to detect and correct than single-bit errors. Since there is a likelihood that soft and/or hard errors will cause physically adjacent cells to provide erroneous data, associating check bits with check words in this manner results in multi-bit errors appearing as single-bit errors to an error correction subsystem. Similarly, the likelihood of multi-bit errors occurring in the same check word may be reduced.

In the example of FIG. 1, a memory array 100 is shown to include storage for sixteen bits. Four rows R1-R4 104 and four columns C1-C4 102 are shown, with the intersection of each row and column generally representing a bit location. For example, four bit locations are labeled as 120A-120D. Also shown are four checkwords, Checkword 1 130, Checkword 2 132, Checkword 3 134, and Checkword 4 136. For convenience, each bit location in the array 100 is labeled with a number which identifies the checkword (130, 132, 134, or 136) to which it is assigned. For example, bit locations 150 and 152 are assigned to checkword 1 130, and bit locations 154 and 156 are assigned to checkword 2 132. As can be seen in the example, bit locations assigned to a given checkword are not adjacent to any other bit locations assigned to the same checkword.

Generally speaking, a memory module typically includes a printed circuit board upon which a plurality of DRAM chips are mounted. Some of these DRAM chips are configured to store data words, while others store check bits associated with given data words. Each data word is protected by a number of check bits forming a check word. These check bits are generated according to a predetermined error correction scheme, such as a Hamming code. A group of check bits is referred to a check word. The check bits are stored in DRAM chips in such a manner that each check bit of a given check word is stored in a physically non-adjacent memory cell with respect to every other check bit in the given check word. Typically, each check bit from a given DRAM chip will be assigned to a different check word.

During a memory access, a data word is accessed, and check words associated with the accessed data word are received by an error correction subsystem. The error correction subsystem will then use the check words to check for the presence of an error, according to the predetermined error correction scheme. Since each of the check bits from a given DRAM chip is assigned to a different check word, multi-bit errors from a given DRAM chip will appear as a plurality of single-bit errors, which are generally easier to detect and correct. Furthermore, since check bits from a given DRAM are assigned to different check words, the likelihood of multiple errors occurring in the same check word may be reduced.

While the approach depicted in FIG. 1 may provide additional benefits as compared to other approaches, it is not completely immune from various other types of problems. For example, one type of failure which may occur involves the failure of a word line. Referring back to FIG. 1, assume that each of rows 104 represent a word line which is activated during a memory access. If, for example, row/word line R1 were to fail, two check bits for each of checkword 1 130, and checkword 3 134 would fail. Consequently, the error would generally not be correctable.

A method to reduce the possibility of uncorrectable multi-bit errors from degrading system operation would be desirable. It would be further desirable to make multi-bit soft errors appear as single-bit soft errors, thereby making the errors easier to correct.

SUMMARY OF THE INVENTION

The problems outlined above may in large part solved by a system and method for error correction for improving multi-bit error protection in computer memory systems, in accordance with the present invention. In one embodiment, no two check bits forming a check word are stored in storage cells which correspond to a same word line of a given memory array.

In one embodiment, a memory module includes a printed circuit board upon which a plurality of DRAM chips are mounted. Some of these DRAM chips are configured to store data words, while others store check bits associated with given data words. Each data word is protected by a number of check bits forming a check word. These check bits are generated according to a predetermined error correction scheme, such as a Hamming code. A group of check bits is referred to a check word. The check bits are stored in DRAM chips in such a manner that a given array word line does not include more than one storage cell assigned to a same checkword.

During a memory access, a data word is accessed, and check words associated with the accessed data word are received by an error correction subsystem. The error correction subsystem will then use the check words to check for the presence of an error, according to the predetermined error correction scheme. In the event of a word line failure, a multi-bit error from the DRAM chip will appear as a plurality of single-bit errors which are generally easier to detect and correct. Consequently, the mean time between failure (MTBF) of the system may be improved. Thus, in various embodiments, the system and method for improving multi-bit error protection in computer memory systems may advantageously reduce the possibility of uncorrectable multi-bit errors occurring.

BRIEF DESCRIPTION OF THE DRAWINGS

A more thorough understanding of the present invention can be obtained by reading and following the detailed description of the preferred embodiment in conjunction with the following drawings, in which.

Figure 1:
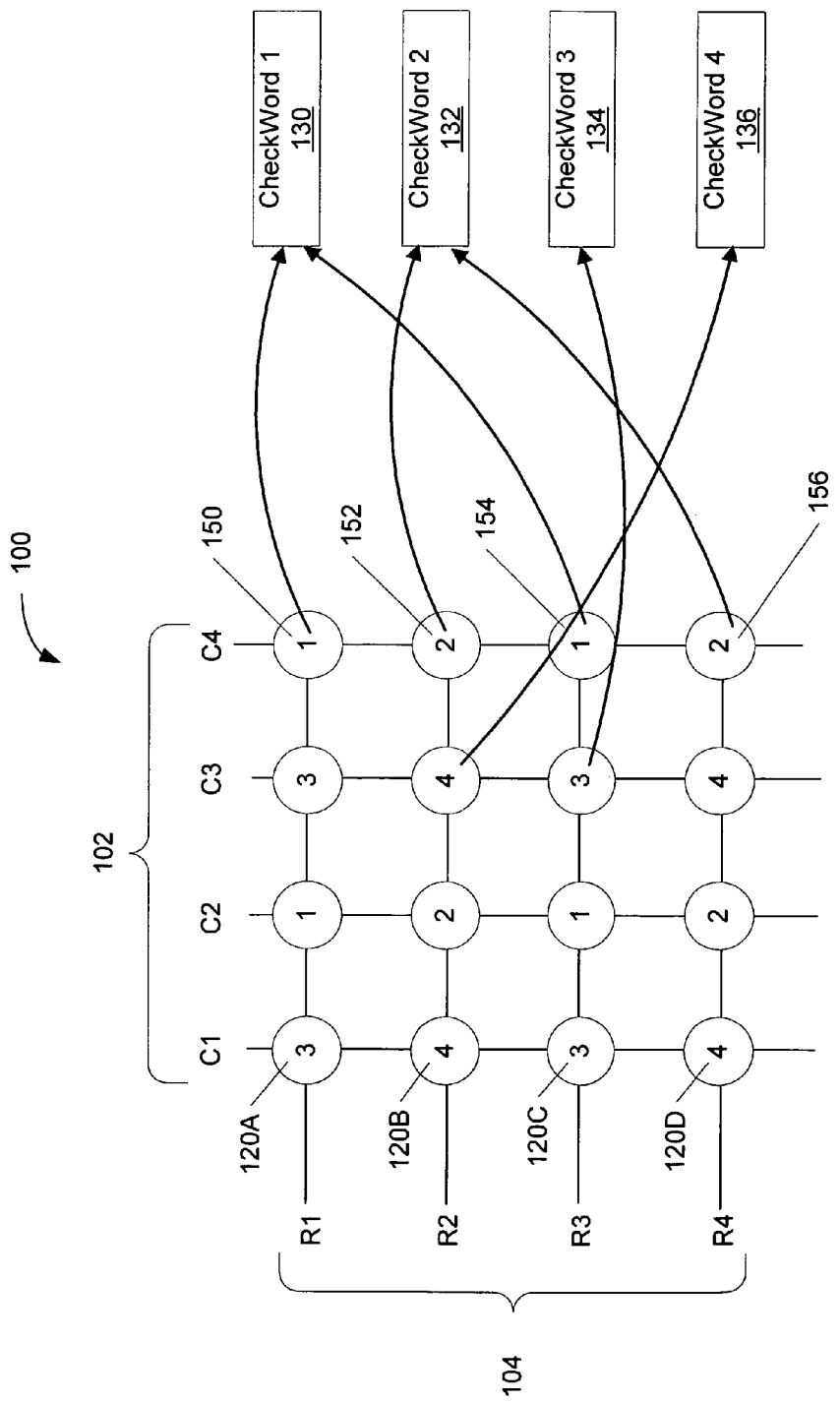
FIG. 1 (prior art) is a drawing illustrating one embodiment of a prior art memory array.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 2:
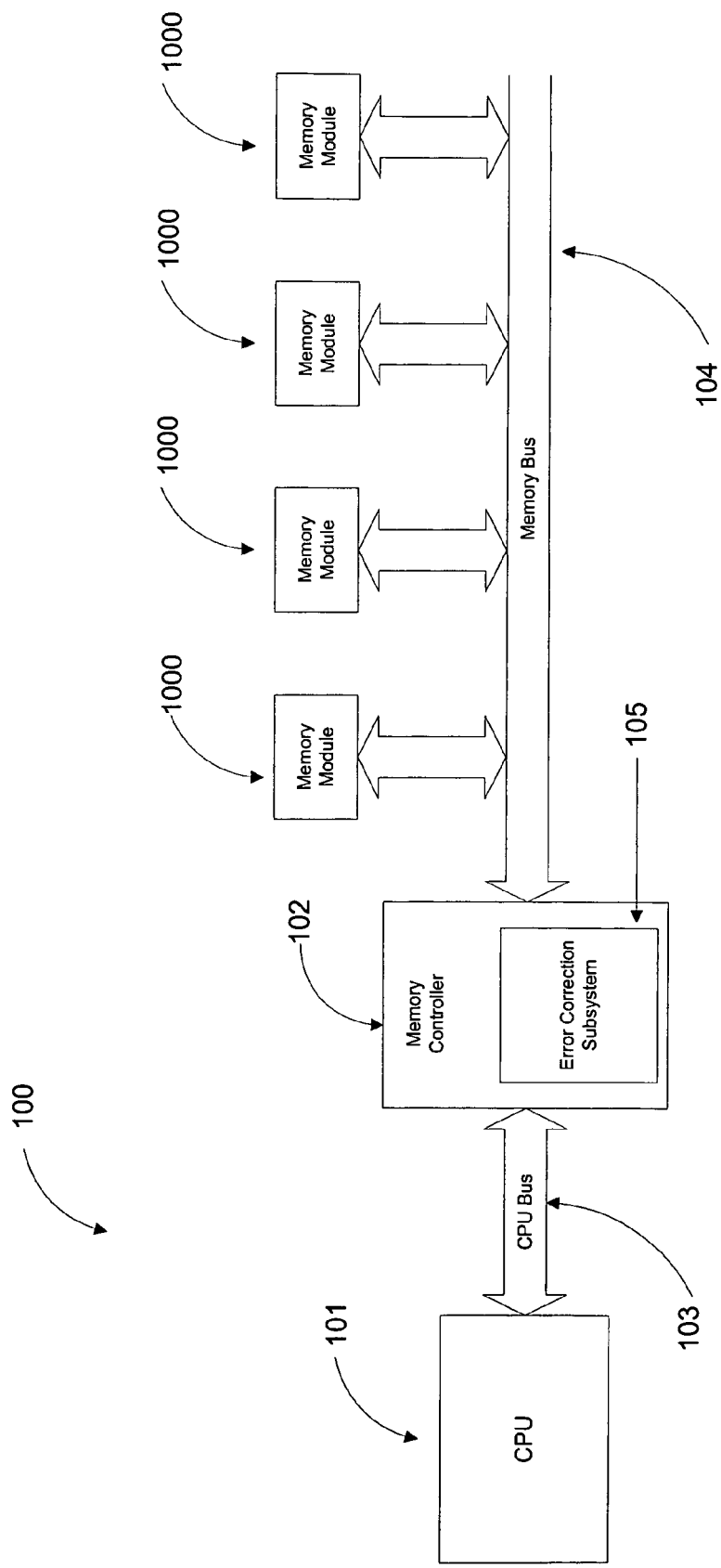
FIG. 2 is a block diagram of one embodiment of a computer system, including an error correction subsystem.

Referring now to FIG. 2, a block diagram of one embodiment of a computer system 100 with an error correction subsystem 105 is shown. In addition to error correction subsystem 105, the computer system includes a CPU 101, a memory controller 102, a CPU bus 103, a memory bus 104, and a plurality of memory modules 1000. Error correction subsystem 105 is contained within memory controller 102, and is configured to detect and correct errors during data transfers on the memory bus, including those transfers of data to and from memory modules 1000. The use of check bits and check words by the error correction subsystem will be explained in further detail below. Error correction subsystem 105 may use one of many different error correction schemes, such as one employing Hamming codes.

Figure 3:
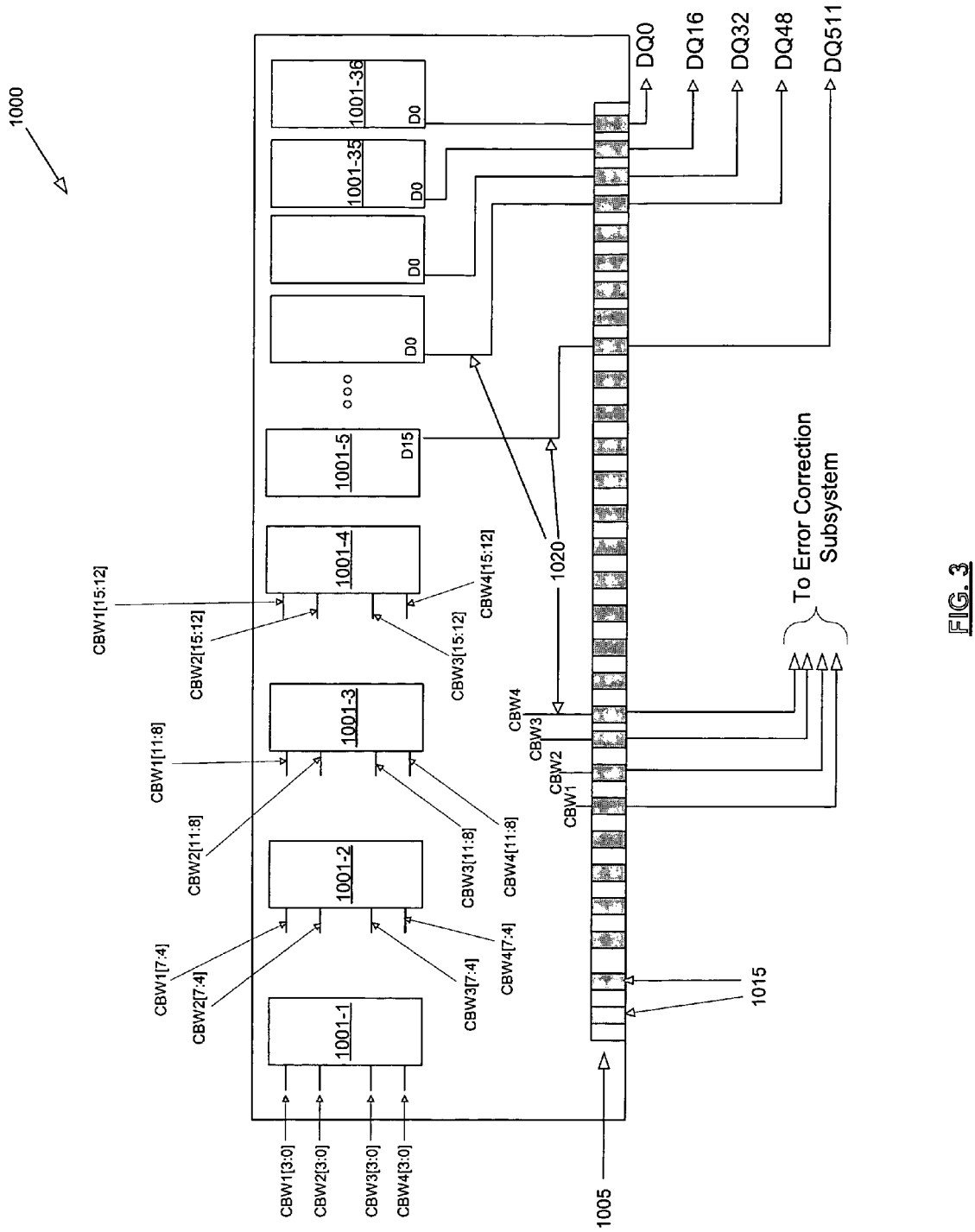
FIG. 3 is a drawing of a memory module as used in the computer system of FIG. 2, wherein the memory module is configured for storage of check bits and data bits.

FIG. 3 is a drawing of one embodiment of a memory module which may be used in the computer system of FIG. 2. Memory module 1000 includes a printed circuit board upon which dynamic random access memory (DRAM) chips 1001-1 through 1001-36 are mounted. Each of these DRAM chips has a data width of 16 bits. In this particular embodiment, four of these DRAM chips, 1001-1 through 1001-4, are used exclusively to store check bits. The remainder of DRAM chips 1001-5 through 1001-36 are used to store data bits. Memory module 1000 also includes an edge connector 1005, with a plurality of electrical contact pads 1015. A plurality of signal lines 1020 couples the electrical contact pads 1015 to the DRAM chips 1001. Data signals are conveyed along signal lines 1020 between the DRAM chips 1001 and electrical contact pads 1015. Data pin D0 of each DRAM chip 1001 is shown coupled to electrical contact pads 1015 by signal lines 1020, with the respective position of the bit in the data word (i.e. DQ0, DQ16, etc.) shown. The most significant bit of the data, DQ511, is coupled to pin D15 of a DRAM chip 1001-5. In this embodiment, 16 check bits are used to protect each data block of 128 bits, with each check word associated with one data block only.

As previously stated, DRAM chips 1001-1 through 1001-4 are used exclusively to store check bits in this embodiment. Each of these DRAM chips stores four check bits of each check word. Each check word is 16 bits, and protects a data block of 128 bits. These check bits are accessed through a plurality of pins designated CBWX[y:z]. For example, CBW1[3:0] shown in the drawing represents four pins of a DRAM chip through which check bits 0 through 3 of check word #1 are accessed. Similarly, CBW2[7:4] represents those pins through which check bits 4 through 7 of check word #2 are accessed. Each of these pins is connected to a respective signal line. Representative signal lines are shown in the drawing as CBW1 through CBW4. In general, these signal lines are routed on the printed circuit board in such a manner that physically adjacent memory cells within each DRAM chip store check bits corresponding to different check words.

Figure 4:
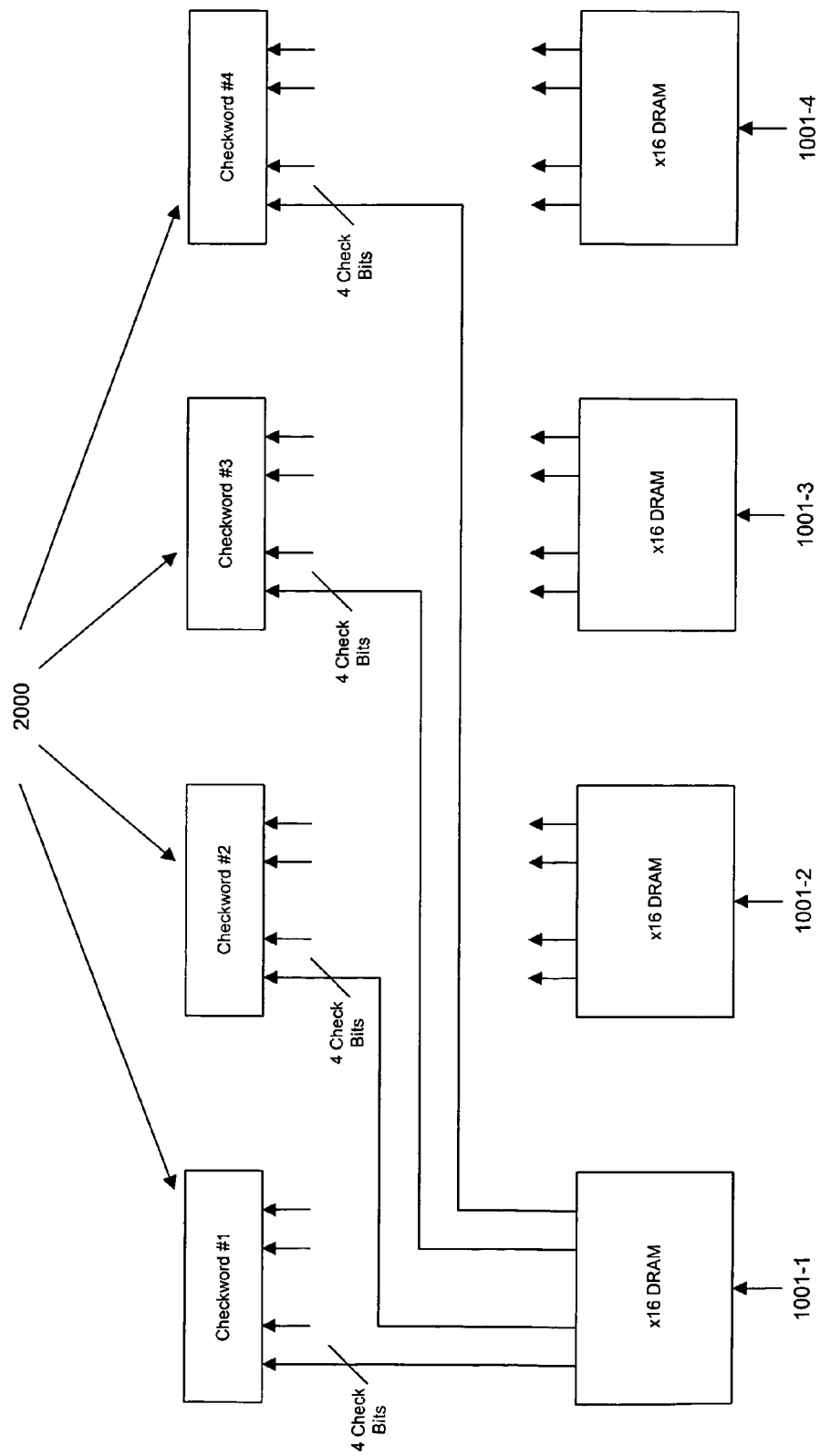
FIG. 4 is a block diagram illustrating the relationship of check bits to check words for DRAM chips with a data path of 16 bits.

Turning now to FIG. 4, a drawing illustrating the relationship of check bits stored in a given DRAM chip to individual check words is shown. A DRAM chip 1001-1 stores four check bits for each of four different check words 2000, which are used by the error correction subsystem 105 of FIG. 2. Each of the four check bits corresponding to a given check word may stored in DRAM chip 1001-1 at a physically non-adjacent memory cell with respect to the other three check bits corresponding to the given check word. Similarly, DRAM chips 1001-2 through 1001-4 each store four check bits for each check word 2000, and each check bit is stored in a physically non-adjacent memory cell with respect to every other check bit of the given check word. During memory access operations, the error correction subsystem 105 of FIG. 2 will access each of the four check words 2000 in parallel.

Figure 5:
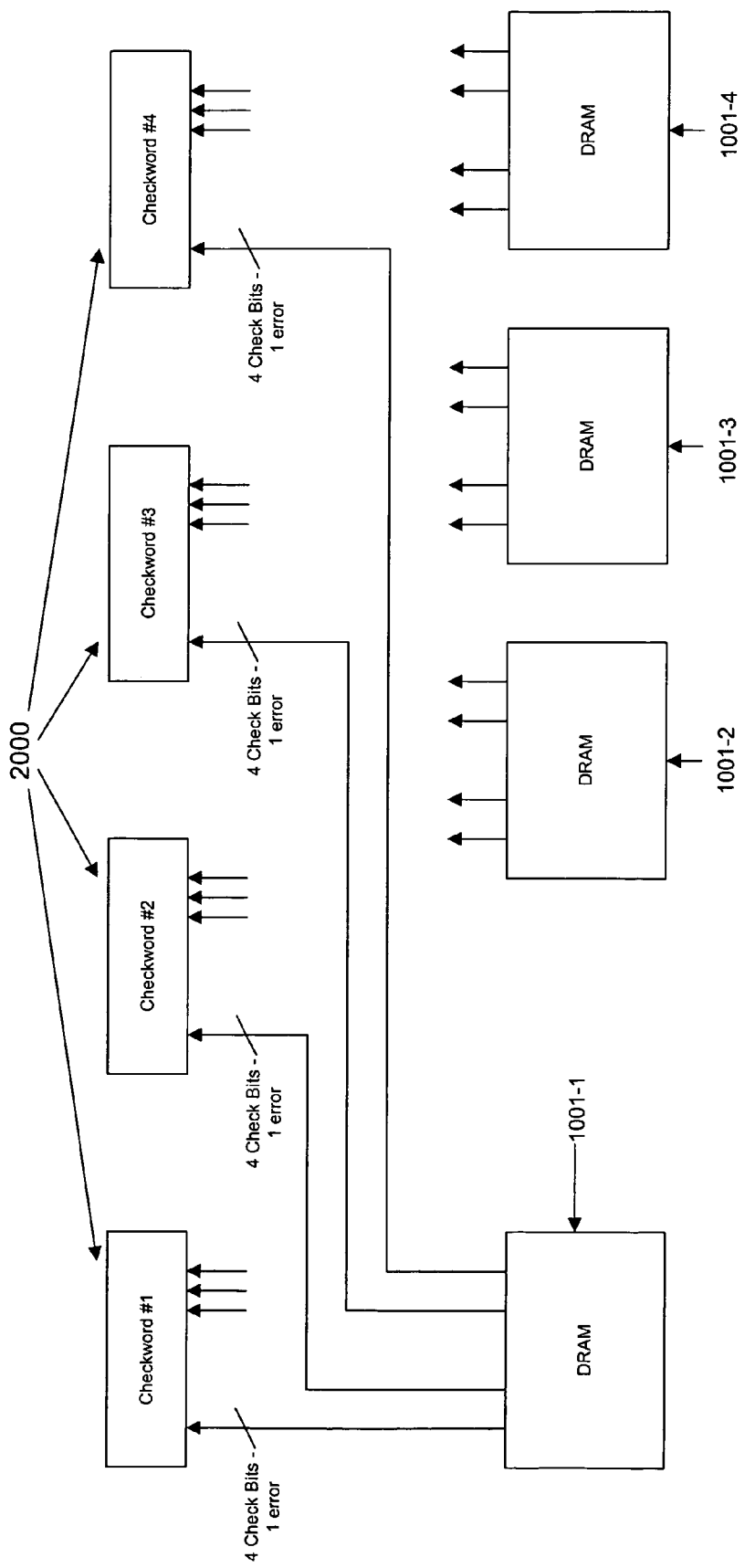
FIG. 5 is a block diagram as in FIG. 5 wherein four check bits from a given memory device are in error, illustrating a multi-bit error presented to an error correction subsystem as a group of single-bit errors.

FIG. 5 is a drawing that illustrates the manner in which multi-bit errors from a single DRAM chip may appear as single bit errors to an error correction subsystem. In the drawing, DRAM chips 1001-1 through 1001-4 each store four check bits of each check word 2000. In this case, a multi-bit error is indicated in DRAM 1001-1, as four check bits are in error. Each check bit in error corresponds to a different check word 2000. No other errors are present in any check bit from the other DRAM chips 1001-2 through 1001-4. Since each check word 2000 contains only one bit in error, the error correction subsystem detects and corrects the four single-bit errors, even though a multi-bit error is present in DRAM chip 1001-1.

Figure 6:
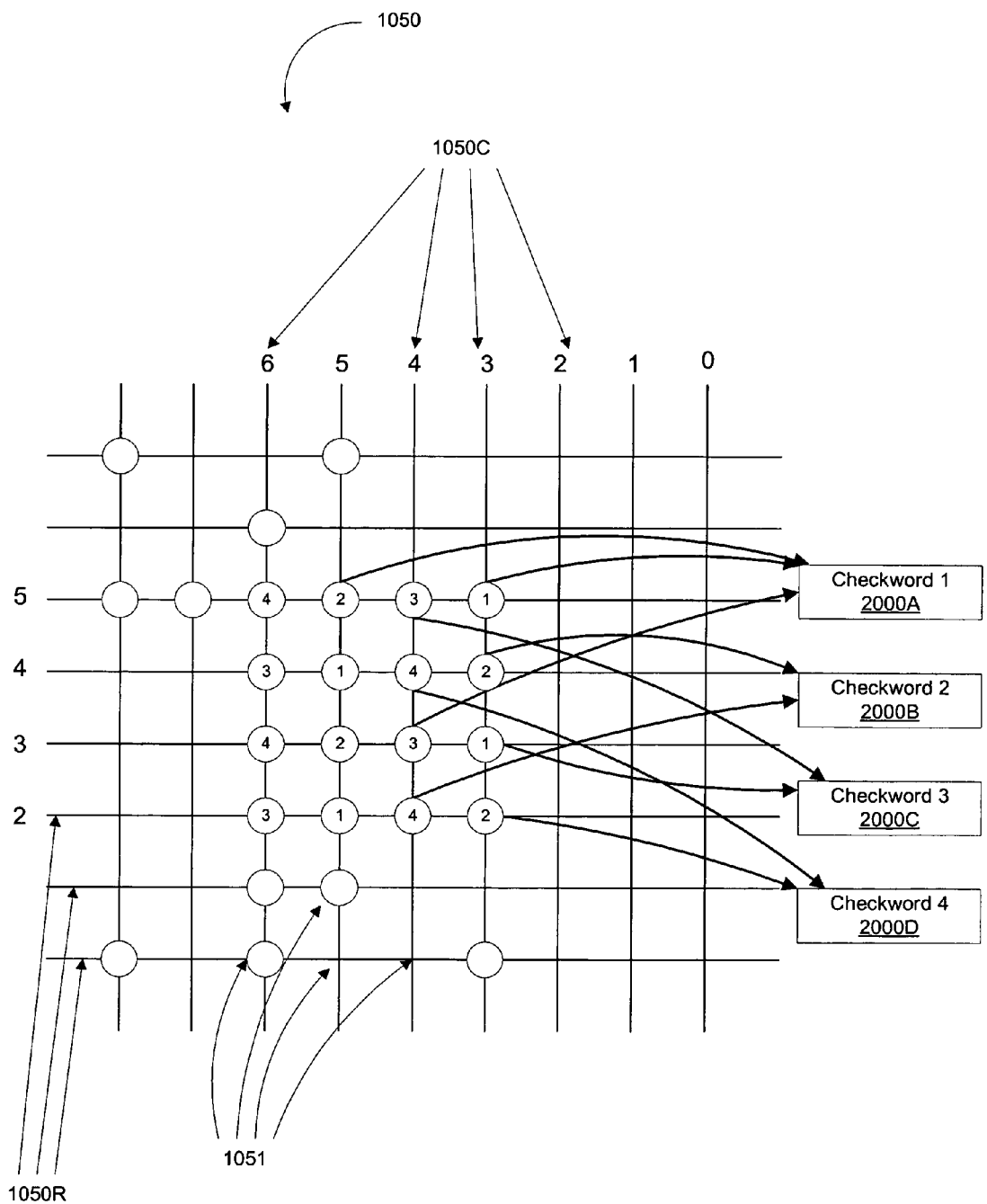
FIG. 6 depicts one embodiment of a memory array within a DRAM.

Turning now to FIG. 6, one embodiment of a memory array within a DRAM is shown which illustrates the manner in which check bits in a given word line are associated with different check words. In this embodiment, memory array 1050 includes a plurality of rows 1050R and columns 1050C. At the intersections of rows 1050R and columns 1050C are memory cells 1051. Each cell in this embodiment can store one check bit, and each check bit is assigned to a check word 2000A-2000D. The check bits are stored such that no two check bits in a given row 1050R are associated with the same check word 2000. For example, the four check bits stored in row 5 of memory array 1050 each correspond to a different checkword 2000. Consequently, if row 5 were to fail, then each checkword 2000 would detect and correct a single bit error. Similarly, the assignment of check bits for each of the other rows 1050R follows the same approach. Therefore, if any particular row/word line were to fail during an access, the error correction subsystem would detect single bit errors which may generally be corrected. It is also noted that in the example of FIG. 6, that no two adjacent check bits are assigned to the same checkword 2000. Accordingly, benefits arising from such non-adjacent assignments may be realized in combination with the word line protection approach described above.

Figure 7A:
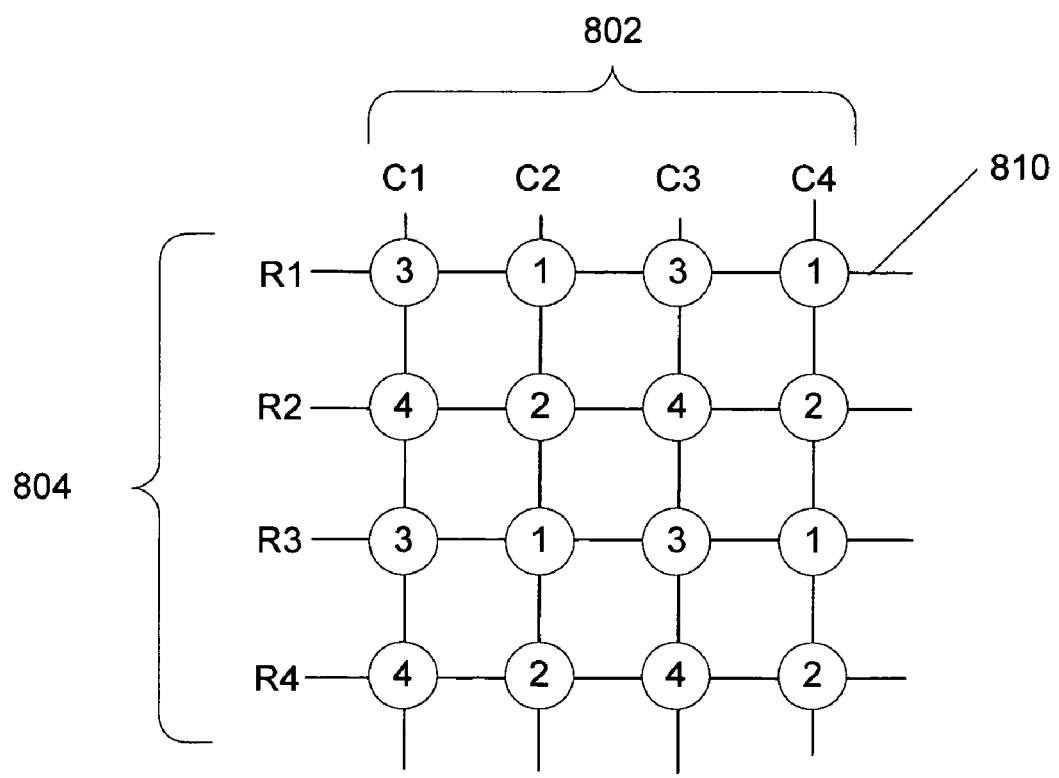
FIG. 7A and FIG. 7B illustrate one embodiment of the assignment of check bits to bit locations in a memory array.
Figure 7B:
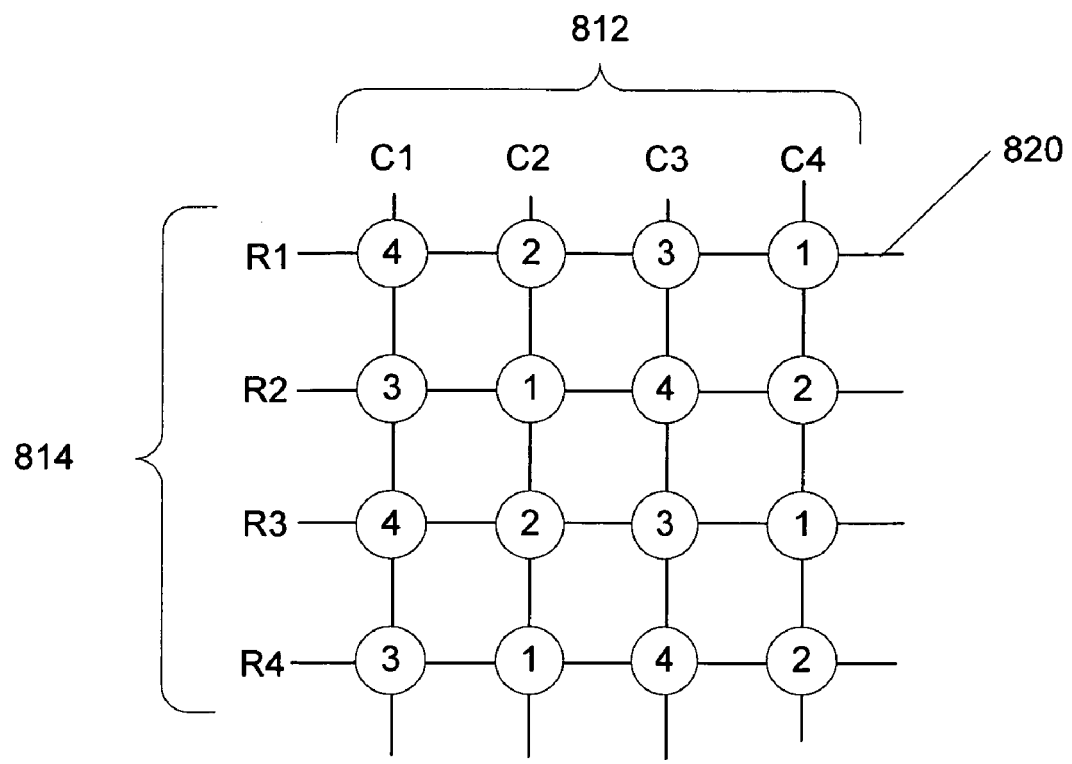

For purposes of direct comparison, FIG. 7A and FIG. 7B illustrate the non-word line protected approach versus the word line protected approach. FIG. 7A shows a memory array with rows 804 and columns 802. Each of the bit locations generally correspond to the row/column intersections and are labeled with a number which indicates a check word to which it is assigned. As shown in the example, while no two adjacent bit locations are assigned to the same checkword, every row/word line includes multiple bits assigned to the same checkword. Consequently, a failure of any of rows R1-R4 will results in the error correction subsystem detecting an uncorrectable multi-bit error in a single error correcting system. For example, failure of row R1 810 will results in multi-bit errors for both checkword 1 and checkword 3.

In contrast, FIG. 7B depicts an embodiment wherein assignment of check bits is such that word line failure may be protected against. In the memory array of FIG. 7B, rows R1-R4 814, and columns C1-C4 812, are shown. As can be seen, no row 814 includes more than a single bit assigned to a given check word. For example, row R1 820 is shown to include bit locations assigned to each of four different checkwords 1-4. Accordingly, a failure of any of rows 814 may result in the detection of single bit errors by the error correcting subsystem. In a system configured to correct single bit errors, the errors caused by the word line failure are correctable. Using such an approach, the MTBF in a given system may be improved.

Figure 8:
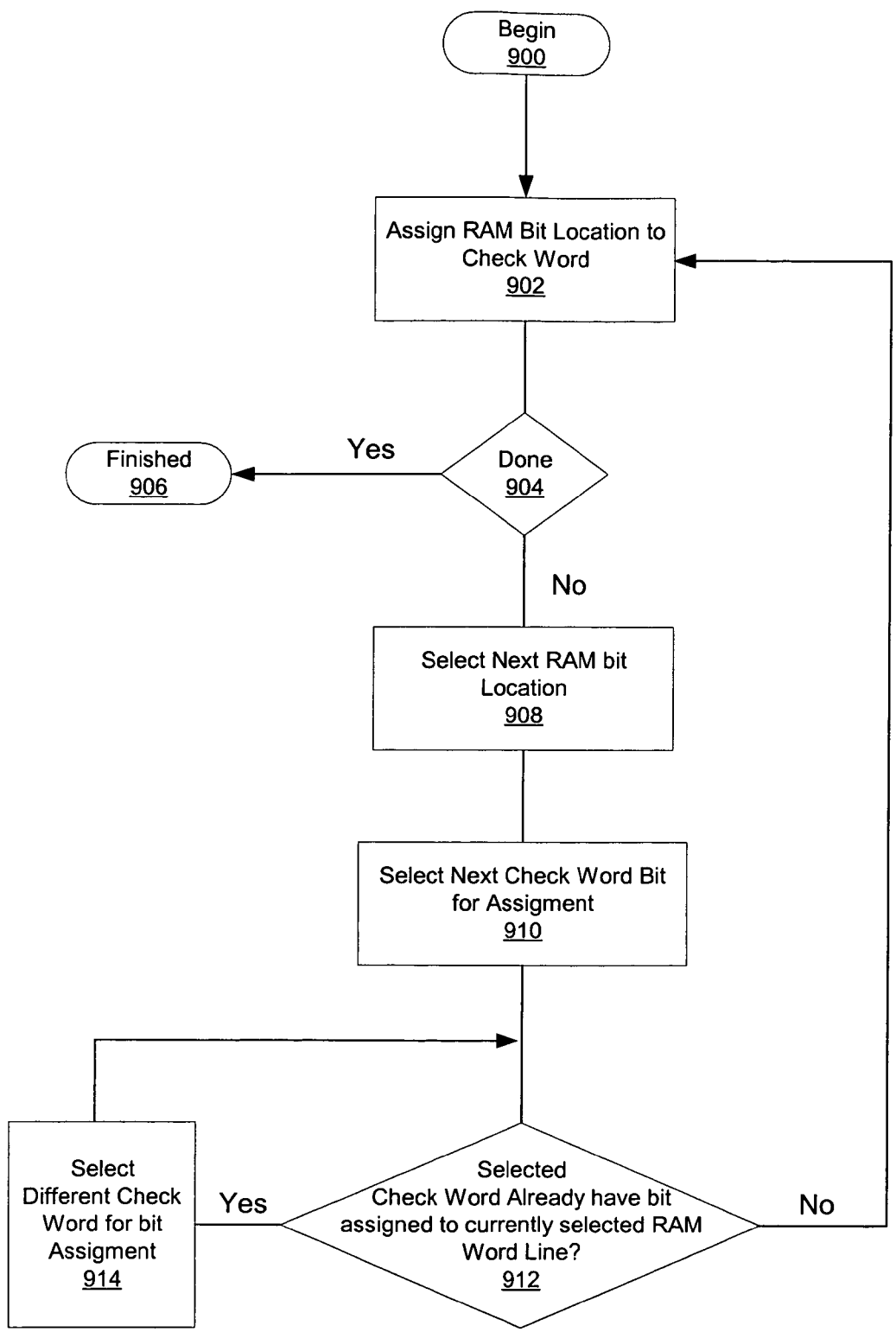
FIG. 8 illustrates one embodiment of a method for assigning check bits to storage locations of a memory array.

FIG. 8 depicts one embodiment of a method for assigning bit locations in a RAM to checkwords in an error correcting system. Of course it is to be understood that the example of FIG. 8, as well as each of the other embodiments described herein, are intended to be exemplary only. Numerous other embodiments are possible and are contemplated. Subsequent to beginning a check bit assignment procedure (block 900), a particular Ram bit location is assigned to a particular checkword (block 902). If the procedure is not done (decision block 904), a next RAM bit location is selected (block 908). A check bit word is then selected for use in assigning a bit to the currently selected RAM bit location (block 910). If the word line which corresponds to the currently selected bit location already has assigned a check bit for the currently selected check word (decision block 912), then a different check word is selected (block 914). Otherwise, the a bit from the selected check word is assigned to the bit location (block 902), and the process continues until done.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A computer system comprising:
   a central processing unit (CPU);
   a memory controller coupled to said CPU and a memory bus, said memory controller including an error correction subsystem, said error correction subsystem configured to generate a plurality of check words corresponding to a plurality of data blocks;
   a memory module coupled to said memory bus including a plurality of memory chips for storing said plurality of check words and said plurality of data blocks, wherein each of said plurality of memory chips includes an array of memory cells;
   wherein within a given array of said array of memory cells, no two check bits of any one of said plurality of check words are stored at memory cells which correspond to a same word line.

2. The computer system as recited in claim 1, wherein at least one of said plurality of memory chips is configured to receive and store multiple check bits of said given check word.

3. The computer system as recited in claim 2, wherein a first subset of said plurality of memory chips is configured to receive and store a given data block corresponding to said given check word.

4. The computer system as recited in claim 3, wherein a second subset of said plurality of memory chips including at least one of said plurality of memory chips is configured to receive and store said given check word, and wherein a first memory chip of said second subset is configured to receive and store a first set of check bits of said given check word.

5. The computer system as recited in claim 4, wherein each bit of said first set of check bits of said given check word is stored at a physically non-adjacent cell within said first memory chip with respect to every other bit of said first set of check bits.

6. The computer system as recited in claim 2, wherein said error correction subsystem is configured to detect an error in data transferred from said memory subsystem, and, wherein said error correction subsystem is configured to, upon detection of an error in said data, to correct said error.

7. The computer system as recited in claim 2, wherein said memory chips are Dynamic Random Access Memory (DRAM) chips.

8. A method for storing check words in a memory module having a plurality of memory chips each including an array of memory cells, said method comprising:
   generating a plurality of check words corresponding to a plurality of data blocks, said check words, said check words including a plurality of check bits;
   storing said plurality of check words and said plurality of data blocks in said memory module;
   wherein within a given array of said array of memory cells, no two check bits of any one of said plurality of check words are stored at memory cells which correspond to a same word line.

9. The method as recited in claim 8, wherein said memory chips are dynamic random access memory (DRAM) chips.

10. A memory subsystem comprising:
    at least one memory module including a plurality of memory chips, wherein each of said plurality of memory chips includes an array of memory cells;
    a memory controller including an error correction subsystem, said error correction subsystem configured to generate a plurality of check words corresponding to a plurality of data blocks;
    wherein within a given array of said array of memory cells, no two check bits of any one of said plurality of check words are stored at memory cells which correspond to a same word line.

11. The memory subsystem as recited in claim 10, wherein said memory chips are dynamic random access memory (DRAM) chips.

12. The memory subsystem as recited in claim 10, wherein each of said memory cells is configured to store one bit of information.

13. The memory subsystem as recited in claim 10, wherein each of said memory modules includes a printed circuit board (PCB), wherein a plurality of memory chips are mounted upon said PCB.

14. A memory module for use in a system having an error correction subsystem, said error correction subsystem is configured to generate a plurality of check words corresponding to a plurality of data blocks, said memory module comprising:
    a printed circuit board;
    a plurality of memory chips mounted upon said printed circuit board for storing said plurality of check words and said plurality of data blocks, wherein each of said plurality of memory chips includes an array of memory cells;
    wherein within a given array of said array of memory cells, no two check bits of any one of said plurality of check words are stored at memory cells which correspond to a same word line.

15. The memory module as recited in claim 14, wherein said memory chips are Dynamic Random Access Memory (DRAM) chips.

16. The memory module as recited in claim 14, wherein said printed circuit board includes a plurality of signal lines.

17. The memory module as recited in claim 16, wherein said plurality of signal lines are routed on said printed circuit board such that any of said check bits stored in said memory cells that are physically adjacent are assigned to different ones of said check words.

18. The memory module as recited in claim 14, wherein a first plurality of said memory chips is configured to store data bits, and a second plurality of said memory chips is configured to store check bits.

* * * * *